United States Patent [19]

Nishiyama et al.

[11] 4,164,676
[45] Aug. 14, 1979

[54] PIEZOELECTRIC CRYSTALLINE FILM OF ZINC OXIDE CONTAINING ADDITIVE ELEMENTS

[75] Inventors: Hiroshi Nishiyama, Mukou; Toshio Ogawa; Tasuku Mashio, both of Nagaokakyo, all of Japan

[73] Assignee: Murata Manufacturing Co., Ltd., Nagaokakyoshi, Japan

[21] Appl. No.: 927,401

[22] Filed: Jul. 24, 1978

[30] Foreign Application Priority Data

Jul. 28, 1977 [JP] Japan .................................. 52/91109

[51] Int. Cl.² .......................................... H01L 41/18
[52] U.S. Cl. ............................. 310/360; 252/69.2; 427/100
[58] Field of Search ............................. 310/311, 360; 252/62.9 R; 427/100

[56] References Cited

U.S. PATENT DOCUMENTS

| | | | |
|---|---|---|---|
| 3,091,707 | 5/1963 | Hutson | 310/360 |
| 3,409,464 | 11/1968 | Shiozawa | 310/360 |
| 3,440,550 | 4/1969 | Moore | 310/360 X |
| 3,471,721 | 10/1969 | Moore | 310/360 X |

*Primary Examiner*—Mark O. Budd
*Attorney, Agent, or Firm*—Birch, Stewart, Kolasch and Birch

[57] ABSTRACT

Piezoelectric crystalline film on a substrate, which is a crystalline zinc oxide film with a c-axis perpendicular to the substrate surface, the crystalline zinc oxide film containing as additive elements, vanadium, manganese and at least one element selected from the group consisting of chromium, iron, cobalt and nickel. The piezoelectric crystalline films are homogeneous and have high resistivity and a smooth surface so that they can be used as a transducer with good conversion efficiency in a wide range of low to high frequencies.

19 Claims, 2 Drawing Figures

PIEZOELECTRIC CRYSTALLINE FILM OF ZINC OXIDE CONTAINING ADDITIVE ELEMENTS

This invention relates to piezoelectric crystalline films comprising zinc oxide having a hexagonal crystal structure.

In recent years, crystalline thin films of zinc oxide which show piezoelectricity have become of major interest as a piezoelectric material for various transducers. Such piezoelectric crystalline films of zinc oxide may be produced by various methods such as, for example, vacuum deposition methods, epitaxial growth methods, sputtering methods and ion plating methods. Among these methods, the sputtering methods, particularly, a radio-frequency sputtering methods has been used very often lately because it has the advantage that a high growth rate of the oriented crystalline film is possible, thus making it possible to mass-produce piezoelectric crystalline films industrially.

When making a piezoelectric crystalline film of zinc oxide on a substrate surface with the radio-frequency sputtering method, ceramics of highly pure zinc oxide has been conventionally used as a film material source. However, even when the radio-frequency sputtering is effected with such a source, the produced piezoelectric crystalline film can not be said that it is a good piezoelectric crystalline film. Because, the film has a rough surface and a c-axis being out of the perpendicular to the substrate surface. If a piezoelectric crystalline film of zinc oxide has a rough surface, various disadvantages occur. For example, when manufacturing an acoustic surface wave filter with such a zinc oxide film, it is difficult to form interdigital transducers on the film surface, and the produced acoustic surface wave filter tends to have disconnection of interdigital transducers, and causes a large propagation loss of acoustic surface waves. Also, if the c-axis of the zinc oxide film is inclined with respect to the axis perpendicular to the substrate surface, the electromechanical coupling factor is lowered, thus making it difficult to produce a piezoelectric crystalline film transducer with good conversion efficiency.

Further, piezoelectric crystalline films of highly pure zinc oxide can be used only at high frequencies, and can not be used at low frequencies since resistivity thereof is not sufficiently high. Thus, an applicable frequency range of such a piezoelectric crystalline film is narrow.

The above matters will be evident from the theory on dielectric relaxation angular frequency ($\omega_c$) which is given by the following equation:

$$\omega_c = \frac{\sigma}{\epsilon_o \epsilon_{ZnO}} = \frac{1}{\epsilon_o \epsilon_{ZnO} \rho_o} \ (rad/s) \quad (1)$$

where
$\sigma$ = conductivity of crystalline film [$\Omega^{-1}m^{-1}$]
$\epsilon_o$ = permittivity of vacuum [F/m]
$\epsilon_{ZnO}$ = permittivity of crystalline film
$\rho_o$ = resistivity of crystalline film [$\Omega.m$]

From the equation (1), it will be seen that the dielectric relaxation angular frequency $\omega_c$ is inversely proportional to the resistivity of the film.

In general, it is recognized that the piezoelectric crystalline film possesses piezoelectricity at frequencies where the following relation exists between the dielectric relaxation angular frequency ($\omega_c$) and an angular frequency ($\omega$) at the used frequency: $\omega_c << \omega$. In other words, the piezoelectric crystalline film can be used as a piezoelectric only in a frequency range where the angular frequency ($\omega$) is sufficiently higher than the dielectric relaxation angular frequency ($\omega_c$) (normally, $\omega > \omega$ frequency $\times$ 100).

For example, the dielectric relaxation angular frequency for the piezoelectric crystalline film consisting of highly pure zinc oxide (purity: 99.99%) can be found by the equation (1).

$$\omega_c = \frac{1}{\epsilon_o \epsilon_{ZnO} \rho_o} = 1.33 \times 10^6 \ (rad/s)$$

where
$\epsilon_o = 8.854 \times 10^{-12}$ (F/m)
$\epsilon_{ZnO} = 8.5$
$\rho_o = 10^6 (\Omega.cm)$ Since an angular frequency ($\omega$) equals $2\pi f$, it is found that the dielectric relaxation frequency $f_c$ is $$f_c = \frac{\omega_c}{2\pi} = \frac{1.33 \times 10^6}{2 \times 3.14} = 2.12 \times 10^5 \ (Hz)$$

Thus, the piezoelectric crystalline films of highly pure zinc oxide can be used at frequencies higher than 100 MHz. In other words, such piezoelectric crystalline films are applicable only at very high frequencies.

As an improved piezoelectric crystalline film of zinc oxide which overcomes the above disadvantages, we have developed a zinc oxide film containing vanadium or manganese. Such a film has a smooth surface, a c-axis approximately perpendicular to the substrate surface, and high resistivity, but it is difficult with such a film to produce transducers having desired characteristics as they are planed since the film is not uniform.

It has now found that this problem can be solved by incorporating vanadium and manganese together with at least one element selected from the group consisting of chromium, iron, cobalt and nickel into a zinc oxide film.

The incorporation of these additive elements is achieved by the use of a ceramic of zinc oxide containing vanadium, manganese and at least one element selected from the group consisting of chromium, iron, cobalt and nickel, as a film material source for sputtering.

It is therefore an object of the present invention to provide an improved piezoelectric crystalline film of zinc oxide which overcomes the aforesaid disadvantages and can be used as a transducer with good conversion efficiency in a wide range of low to high frequencies.

According to the present invention, there is provided a piezoelectric crystalline film on a substrate, the film being a crystalline zinc oxide film with a c-axis perpendicular to the substrate surface, characterized in that said zinc oxide film contains vanadium, manganese and at least one element selected from the group consisting of chromium, iron, cobalt and nickel.

In the piezoelectric crystalline films of zinc oxide according to the present invention, additive elements, i.e., vanadium, manganese and at least one element selected from the group consisting of chromium, iron, cobalt and nickel, may be present in any form such as, for example, oxides and compounds thereof. A category of the compounds includes, without being limited to, sulphides, sulphates, phosphates, phosphides, and selenates of the above additive elements.

Since the content of the additives have a great influence on the electrical and physical properties of the films, it is preferred to limit the content of the additives to the following ranges. The content of vanadium may range from 0.01 to 20.0 atomic percent when converted into the percentage of vanadium atoms. Because, if the content of vanadium is less than 0.01 atomic percent, the film changes for the worse in its quality, and if more than 20.0 atomic percent, the direction of the crystallographic orientation of the film can not be well controlled, resulting in the worse in the orientation of the piezoelectric crystalline film. The content of manganese may range from 0.01 to 20.0 atomic percent when converted into the percentage of manganese atoms. Because, a small amount of manganese less than 0.01 atomic percent results in the change for the worse in the film quality and does not contribute to the improvement in the resistivity of the film, and a large amount of manganese more than 20.0 atomic percent results in the change for the worse in the orientation of the piezoelectric crystalline film. The content of at least one elements selected from the above group may range from 0.01 to 20.0 atomic percent when converted into a total sum of the percentage of respective element atoms. Because, if the content of these elements is less than 0.01 atomic percent, they will not contribute to the improvement in the homogeneities in the film, and if more than 20.0 atomic percent, the film changes for the worse in the orientation.

As a material for the substrate on which a piezoelectric crystalline film is formed, there may be used those such as, for example, metal, glass, ceramics, single crystal, resin, rubber and the like.

The piezoelectric crystalline film of the present invention has a c-axis perpendicular to the substrate surface, thus making it possible to produce piezoelectric transducers with good conversion efficiency. Further, the piezoelectric crystalline films of the present invention have high resistivity, so that the films are applicable in a wide range of low to low frequencies.

The piezoelectric crystalline films of the present invention may be made by any conventional methods such as, for example, chemical vapor deposition, vapor deposition, reactive evaporation process, sputtering, radio-frequency sputtering methods, co-sputtering methods, ion plating methods or ion beam deposition methods.

These and other objects, features and advantages of the present invention will be further apparent from the following description with respect to examples and the accompanying drawings, in which.

Figure 1:
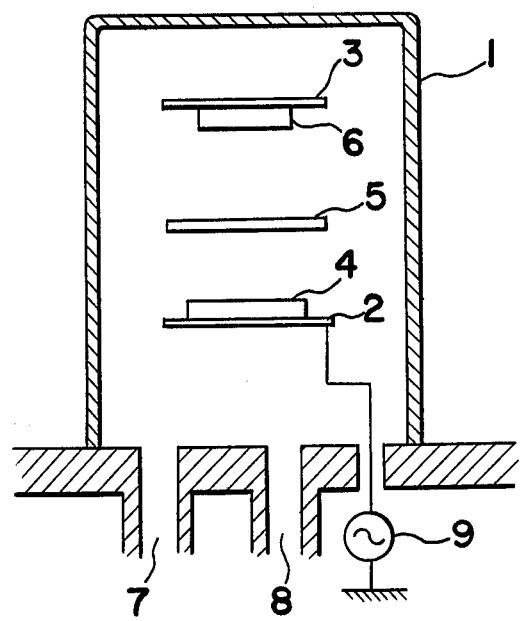
FIG. 1 is a diagrammatic view of a known radio-frequency sputtering apparatus which is used for making piezoelectric crystalline films of the present invention.

Referring now to FIG. 1, there is shown a radio-frequency sputtering apparatus with two electrodes which is used for making piezoelectric crystalline films according to the present invention. Numeral 1 shows a bell jar in which a pair of electrodes, i.e., a planar cathode 2 and a planar anode 3, are positioned in parallel. Fixed on the cathode 2 is a film material source 4 consisting essentially of a ceramic of zinc oxide containing vanadium, manganese and at least one element selected from the group consisting of chromium, iron, cobalt and nickel. A shutter 5 is positioned between electrodes 2 and 3. A substrate 6 consisting of, for example, glass, metal, ceramics, single crtstal, or resin is fixed to the bottom of the anode 3. The substrate 6 is heated to a temperature of soon temperature to 500° C. during sputtering. A vent 7 and gas inlet 8 are provided in the bell jar 1.

The radio-frequency sputtering is effected in the following manner: After making it airtight, the bell jar 1 is evacuated through the vent 7 to a vacuum more than $1 \times 10^{-6}$ Torr, and then supplied with argon or oxygen gas or a mixture of argon and oxygen through the gas inlet 8, whereby adjusting the pressure to $1 \times 10^{-1}$ to $1 \times 10^{-4}$ Torr. A radio-frequency voltage is applied between the bell jar 1 and the cathode 2 by the radio-frequency electric power source 9. Electric power of 2 to 8 W/cm$^2$ is supplied to the film material source 4.

The film material sources consisting essentially of ceramics of zinc oxide containing vanadium, manganese, and at least one element selected from the above group are prepared in the following manner: Using powder of ZnO, $V_2O_5$, $MnCO_3$, $Fe_2O_3$, $Cr_2O_3$, CoO and NiO as raw materials, there are prepared mixtures to produce ceramics of zinc oxide each having a compositional proportion shown in Table 1. Each of the mixture is milled by the wet process, dried and then calcined at 600° to 800° C. for 2 hours. The presintered body is curshed, milled by the wet process with an organic binder and then dried. The resultant powder is shaped into discs with a diameter of 100mm and a thickness of 5mm at a pressure of 1000 kg/cm$^2$ and then fired at 1200° C. for 2 hours to obtain film material sources.

The thus obtained film material sources were subjected to measurements of resistivity and percentage of bulk density $d_s$ to theoretical density $d_t$ ($d_s/d_t \times 100$). The results are shown in Table 1.

Using the respective film material sources obtained, piezoelectric crystalline films of zinc oxide containing said additive elements are made on glass substrates with the aforesaid radio-frequency sputtering apparatus. The radio-frequency sputtering is carried out under the following conditions: A mixed gas of 90 vol % of argon and 10 vol % of oxygen is supplied to the bell jar 1 through the gas inlet 8, whereby adjusting the pressure in the bell jar to $2 \times 10^{-3}$ Torrs. A glass substrate is heated to and kept at 350° C. The source 4 is supplied 6 W/cm$^2$ of an electric power with a frequency of 13.56 MHz.

The c-axis orientation of the thus obtained piezoelectric crystalline film was measured with a locking curve method by X-ray diffraction (Ref.: Minakata, Chubachi and Kikuchi "Quantitative Representation of c-axis Orientation of Zinc Oxide Piezoelectric Thin Films" The 20th Lecture of Applied Physics Federation. Vol. 2 (1973) page 84; and Makoto Minakata, The Tohoku University Doctor's Thesis (1974)). The mean value ($\overline{X}$) and standard deviation ($\sigma$) of the angle of c-axis with respect to the axis perpendicular to the substrate surface were obtained from respective specimens. The results are shown in Table 1. Included in Table 1 are results of the measurements of resistivity, quality and adhesion of the crystalline films. The measurement of adhesion to the substrate was carried out by the thermal shock test methos 107C of MIL-STD-202D. A film which peeled off from the surface of the substrate was judged as "bad", a film in which cracks were produced was judged as "passable" and a film which showed no change was judged as "good".

Table 1

| Specimen No. | Additive (atomic %) V | Mn | (Cr, Fe, Co, Ni) | Film material source Resistivity (Ω.cm) | $(d_s/d_t) \times 100$ (%) | Zinc oxide film Orientation | $\sigma$ | Resistivity (Ω.cm) | Quality | Adhesion |
|---|---|---|---|---|---|---|---|---|---|---|
| 1 | 0.1 | — | — | $1.7 \times 10^7$ | 99.5 | 1.6 | 2.6 | $5.2 \times 10^6$ | smooth | passable |
| 2 | — | 2.0 | — | $6.3 \times 10^8$ | 92.0 | 2.3 | 2.7 | $7.6 \times 10^{10}$ | " | " |
| 3 | 0.01 | 0.01 | — | $6.6 \times 10^7$ | 98.0 | 1.1 | 2.4 | $3.6 \times 10^8$ | " | " |
| 4 | 0.005 | 0.1 | Co = 2.0 | $4.5 \times 10^7$ | 89.0 | 3.5 | 2.4 | $2.9 \times 10^{10}$ | " | good |
| 5 | 0.1 | 0.005 | Cr = 2.0 | $2.2 \times 10^7$ | 99.6 | 5.2 | 5.4 | $9.1 \times 10^5$ | " | " |
| 6 | 0.01 | 0.01 | Ni = 0.005 | $8.3 \times 10^7$ | 98.2 | 1.9 | 2.7 | $3.1 \times 10^9$ | " | passable |
| 7 | 0.01 | 0.01 | Fe = 0.01 | $4.4 \times 10^6$ | 98.0 | 1.7 | 3.2 | $1.2 \times 10^9$ | " | good |
| 8 | 0.1 | 1.0 | Cr = 2.0 | $7.2 \times 10^9$ | 99.7 | 2.8 | 2.8 | $7.1 \times 10^{11}$ | " | " |
| 9 | 0.1 | 10.1 | Co = 2.0, Ni = 0.01 | $2.0 \times 10^{13}$ | 99.6 | 3.1 | 2.8 | $8.2 \times 10^{13}$ | " | " |
| 10 | 0.1 | 10.0 | Cr = 1.0, Fe = 5.0, Co = 1.0, Ni = 0.01 | $6.1 \times 10^{12}$ | 99.5 | 0.9 | 4.7 | $5.9 \times 10^{13}$ | " | " |
| 11 | 5.0 | 5.0 | Cr = 0.1, Fe = 0.1 | $8.3 \times 10^{11}$ | 98.5 | 2.4 | 4.2 | $6.7 \times 10^{12}$ | " | " |
| 12 | 10.0 | 0.1 | Cr = 0.1, Co = 5.0 | $9.9 \times 10^8$ | 98.2 | 1.4 | 3.5 | $5.3 \times 10^{10}$ | smooth | good |
| 13 | 10.0 | 0.1 | Fe = 5.0, Co = 5.0, Ni = 10.0 | $5.0 \times 10^7$ | 98.4 | 3.3 | 3.6 | $2.6 \times 10^{10}$ | " | " |
| 14 | 10.0 | 10.0 | Co = 5.0 | $3.0 \times 10^{12}$ | 98.3 | 4.2 | 4.5 | $3.7 \times 10^{13}$ | " | " |
| 15 | 20.0 | 20.0 | Ni = 20.0 | $1.5 \times 10^{13}$ | 97.9 | 4.4 | 5.4 | $1.4 \times 10^{11}$ | " | " |
| 16 | 20.0 | 30.0 | Fe = 1.0 | $1.9 \times 10^8$ | 97.3 | — | — | — | — | — |
| 17 | 0.01 | 1.0 | Cr = 30.0, Co = 10.0 | $3.0 \times 10^9$ | 98.1 | — | — | — | — | — |

As can be seen from Table 1, the piezoelectric crystalline films according to the present invention have a c-axis approximately perpendicular to the substrate surface, from which it will be understood that the piezoelectric crystalline films of the present invention possess a large electromechanical coupling factor, i.e., good conversion efficiency. Further, the piezoelectric crystalline films of the present invention are smooth, and have good adhesion to the substrate and very high resistivity. As mentioned above, the dielectric relaxation angular frequency ($\omega_c$) is inversely proportional to the resistivity, so that the film with high resistivity can be used at low frequencies.

An applicable frequency range of the piezoelectric crystalline films of the present invention can be obtained by the determination of $\omega_c$ with the aforesaid equation (1).

The values of $\omega_c$ for the specimens of the present invention are ranging from $10^{-1}$ to $10^3$. Thus, the lowermost applicable frequency of the piezoelectric crystalline films of the present invention is not less than 10 Hz. This means that the piezoelectric crystalline films of the present invention can be used in a wide range of low to high frequencies. Thus, the piezoelectric crystalline films of the present invention can be applied to low frequency transducers such as, for example, a miniaturized tunning fork; and electronic devices such as, for example, a wave guide.

Figure 2:
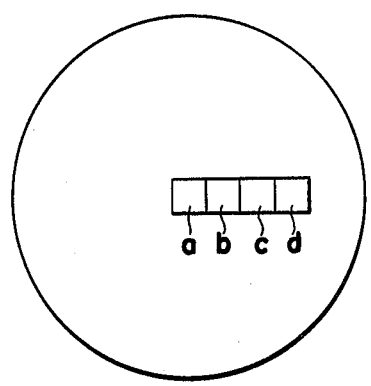
FIG. 2 is a plan view of a piezoelectric crystalline film.

In order to investigate the homogeneity of the film of the present invention, a piezoelectric crystalline film was formed on a glass substrate with a diameter of 100 mm under the aforesaid sputtering conditions by using each film material source in Table 1, and then subjected to the measurement of the resistivity thereof. The resistivity of the film was measured at four distinct square regions indicated by symbols a to d in FIG. 2, the regions having an area of 10 mm×10 mm and being selected in side by side relationship in the direction from the center of the film to the circumference thereof. The center of the film coincides with the center of the square region a. The results are shown in Table 2. Mean values ($\overline{X}$) of the resistivity in Table 1 are also inserted in Table 2 together with the resistivity of the film at respective measuring regions and the standard deviation ($\sigma$) thereof.

As can be seen from the results in Table 2, the resistivity of each piezoelectric crystalline film of the present invention varies scarcely from region to region, from which it will be seen that according to the present invention the piezoelectric crystalline films with uniform characteristics can be obtained industrially. The improvement in the homogeneity of the piezoelectric crystalline film is considered to be achieved by the incorporation of at least one transition element selected from the group consisting of chromium, iron, cobalt and nickel.

Table 2

| Specimen No. | Film resistivity (Ω.cm) $\overline{X}$ | Resistivity at measuring region (Ω.cm) a | b | c | d | $\sigma$ |
|---|---|---|---|---|---|---|
| 1 | $5.2 \times 10^6$ | $3.1 \times 10^5$ | $1.5 \times 10^6$ | $8.9 \times 10^6$ | $1.0 \times 10^7$ | 4.3 |
| 2 | $7.6 \times 10^{10}$ | $4.4 \times 10^9$ | $2.2 \times 10^{10}$ | $9.7 \times 10^{10}$ | $1.8 \times 10^{11}$ | 6.9 |
| 3 | $3.6 \times 10^8$ | $2.6 \times 10^6$ | $8.5 \times 10^7$ | $2.7 \times 10^8$ | $1.1 \times 10^9$ | 4.4 |
| 4 | $2.9 \times 10^{10}$ | $1.8 \times 10^{10}$ | $2.1 \times 10^{10}$ | $2.5 \times 10^{10}$ | $5.2 \times 10^{10}$ | 1.4 |
| 5 | $9.1 \times 10^5$ | $6.9 \times 10^5$ | $8.8 \times 10^5$ | $9.5 \times 10^5$ | $11.0 \times 10^5$ | 1.5 |
| 6 | $3.1 \times 10^9$ | $1.3 \times 10^7$ | $5.8 \times 110^8$ | $1.7 \times 10^9$ | $1.0 \times 10^{10}$ | 4.0 |
| 7 | $1.2 \times 10^9$ | $1.0 \times 10^9$ | $1.2 \times 10^9$ | $1.2 \times 10^9$ | $1.3 \times 10^9$ | 0.11 |
| 8 | $7.1 \times 10^{11}$ | $6.8 \times 10^{11}$ | $7.0 \times 10^{11}$ | $7.2 \times 10^{11}$ | $7.4 \times 10^{11}$ | 0.17 |
| 9 | $8.2 \times 10^{13}$ | $7.8 \times 10^{13}$ | $8.1 \times 10^{13}$ | $8.2 \times 10^{13}$ | $8.5 \times 10^{13}$ | 0.25 |

Table 2-continued

| Specimen No. | Film resistivity (Ω.cm) X | Resistivity at measuring region (Ω.cm) | | | | |
|---|---|---|---|---|---|---|
| | | a | b | c | d | σ |
| 10 | $5.9 \times 10^{13}$ | $5.4 \times 10^{13}$ | $5.7 \times 10^{13}$ | $6.0 \times 10^{13}$ | $6.3 \times 10^{13}$ | 0.33 |
| 11 | $6.7 \times 10^{12}$ | $6.0 \times 10^{12}$ | $6.3 \times 10^{12}$ | $7.1 \times 10^{12}$ | $7.2 \times 10^{12}$ | 0.51 |
| 12 | $5.3 \times 10^{10}$ | $4.8 \times 10^{10}$ | $5.2 \times 10^{10}$ | $5.5 \times 10^{10}$ | $5.5 \times 10^{10}$ | 0.29 |
| 13 | $2.6 \times 10^{10}$ | $1.9 \times 10^{10}$ | $2.4 \times 10^{10}$ | $2.9 \times 10^{10}$ | $3.1 \times 10^{10}$ | 0.47 |
| 14 | $3.7 \times 10^{13}$ | $3.2 \times 10^{13}$ | $3.4 \times 10^{13}$ | $3.8 \times 10^{13}$ | $4.2 \times 10^{13}$ | 0.38 |
| 15 | $1.4 \times 10^{11}$ | $0.9 \times 10^{11}$ | $1.1 \times 10^{11}$ | $1.5 \times 10^{11}$ | $2.0 \times 10^{11}$ | 0.42 |
| 16 | — | — | — | — | — | — |
| 17 | — | — | — | — | — | — |

In the above examples, the additive elements are used in the oxide form, but any other form such as metal, alloy, compound thereof may be used as raw materials for preparing film material sources.

The use of a film material source containing vanadium, manganese and at least one element selected from the group mentioned above has its own advantages, as follows.

When mass-producing piezoelectric crystalline films industrially by the radio-frequency sputtering method, it is necessary to increase the crystal growth rate as much as possible. To do this, the electric power supplied to the film material source per unit area thereof is increased with the results that the film material source is required to have a high bulk density. This requirement is fully satisfied by the sources containing vanadium, manganese and at least one element selected from the above group. As is evident from Table 1, these film material sources have a bulk density higher than that of the conventionally used sources. Thus, the film material sources containing the above additive elements make it possible to mass-produce zinc oxide piezoelectric crystalline films by the use of high electric films by the use of high electric powers.

What is claimed is:

1. A piezoelectric crystalline film on a substrate, said film being a crystalline zinc oxide film with a c-axis perpendicular to the substrate surface, characterized in that said crystalline zinc oxide film contains, as additive elements vanadium, manganese, and at least one element selected from the group consisting of chromium, iron, cobalt and nickel.

2. A piezoelectric crystalline film according to claim 1 wherein the additive elements are vanadium, manganese, and one element selected from said group, and the content of each additive element is 0.01 to 20.0 atomic percent.

3. A piezoelectric crystalline film according to claim 2 wherein said one element is chromium.

4. A piezoelectric crystalline film according to claim 2 wherein said one element is iron.

5. A piezoelectric crystalline film according to claim 2 wherein said one element is cobalt.

6. A piezoelectric crystalline film according to claim 2 wherein said one element is nickel.

7. A piezoelectric crystalline film according to claim 1 wherein the additive elements are vanadium. manganese, and two elements selected from said group, the content of vanadium and that of manganese are 0.01 to 20.0 atomic percent, respectively, and the sum of the content of said selected two elements is 0.01 to 20.0 atomic percent.

8. A piezoelectric crystalline film according to claim 7 wherein said selected two elements are chromium and iron.

9. A piezoelectric crystalline film according to claim 7 wherein said selected two elements are chromium and cobalt.

10. A Piezoelectric crystalline film according to claim 7 wherein said selected two elements are chromium and nickel.

11. A piezoelectric crystalline film according to claim 7 wherein said selected two elements are iron and cobalt.

12. A piezoelectric crystalline film according to claim 7 wherein said selected two elements are iron and nickel.

13. A piezoelectric crystalline film according to claim 7 wherein said selected two elements are cobalt and nickel.

14. A piezoelectric crystalline film according to claim 1 wherein the additive elements are vanadium, manganese, and three elements selected said group, the content of vanadium and that of manganese are 0.01 to 20.0 atomic percent, respectively, and the sum of the content of said selected three elements is 0.01 to 20.0 atomic percent.

15. A piezoelectric crystalline film according to claim 14 wherein said selected three elements are chromium, iron and cobalt.

16. A piezoelectric crystalline film according to claim 14 wherein said selected three elements are chromium, iron and nickel.

17. A piezoelectric crystalline film according to claim 14 wherein said selected three elements are chromium, cobalt and nickel.

18. A piezoelectric crystalline film according to claim 14 wherein said selected three elements are iron, cobalt and nickel.

19. A piezoelectric crystalline film according to claim 1 wherein the additive elements are vanadium, manganese, chromium, iron, cobalt and nickel, the content of vanadium and that of manganese are 0.01 to 20.0 atomic percent, and the sum of the content of the other elements is 0.01 to 20.0 atomic percent.

* * * * *